(12) United States Patent
Anthony

(10) Patent No.: US 7,576,586 B2
(45) Date of Patent: Aug. 18, 2009

(54) COMMON-MODE CHARGE CONTROL IN A PIPELINED CHARGE-DOMAIN SIGNAL-PROCESSING CIRCUIT

(75) Inventor: Michael P. Anthony, Andover, MA (US)

(73) Assignee: Kenet, Inc., Woburn, MA (US)

( * ) Notice: Subject to any disclaimer, the term of this patent is extended or adjusted under 35 U.S.C. 154(b) by 8 days.

(21) Appl. No.: 12/069,433

(22) Filed: Feb. 8, 2008

(65) Prior Publication Data

US 2008/0205581 A1    Aug. 28, 2008

Related U.S. Application Data

(60) Provisional application No. 60/900,675, filed on Feb. 9, 2007.

(51) Int. Cl.
*H03H 11/26* (2006.01)
(52) U.S. Cl. .................. 327/284; 327/285; 377/57; 377/59
(58) Field of Classification Search ............ 377/57–62; 327/284–285, 287–288
See application file for complete search history.

(56) References Cited

U.S. PATENT DOCUMENTS

| 6,222,175 | B1 | 4/2001 | Krymski |
| 6,570,516 | B1* | 5/2003 | Barker .................... 341/122 |
| 6,829,311 | B1* | 12/2004 | Riley ..................... 375/326 |

OTHER PUBLICATIONS

Paul, S.A., et al., "A Nyquist-Rate Pipelined Oversampling A/D Converter," *IEEE Journal of Solid-State Circuits* 34 (12):1777-1787 (Dec. 31, 1999).

* cited by examiner

*Primary Examiner*—An T Luu
(74) *Attorney, Agent, or Firm*—Hamilton, Brook, Smith & Reynolds, P.C.

(57) ABSTRACT

In a differential bucket-brigade device (BBD) pipeline it is necessary for proper circuit function to maintain the common-mode charge within an acceptable range at each pipeline stage. Embodiments of the present invention provide for reducing common-mode charge variations in a differential charge-domain pipeline. Common mode charge at a given stage of the pipeline is adjusted according to one or more measured characteristics, thereby controlling common mode charge variation throughout the differential charge-domain pipeline.

33 Claims, 11 Drawing Sheets

COMMON-MODE CHARGE CONTROL IN A PIPELINED CHARGE-DOMAIN SIGNAL-PROCESSING CIRCUIT

RELATED APPLICATION(S)

This application claims the benefit of U.S. Provisional Application No. 60/900,675, filed on Feb. 9, 2007. The entire teachings of the above application(s) are incorporated herein by reference.

BACKGROUND OF THE INVENTION

In charge-domain signal-processing circuits, signals are represented as charge packets. These charge packets are stored, transferred from one storage location to another, and otherwise processed to carry out specific signal-processing functions. Charge packets are capable of representing analog quantities, with the charge-packet size in coulombs being proportional to the signal represented. Charge-domain operations such as charge-transfer are driven by 'clock' voltages, providing discrete-time processing. Thus, charge-domain circuits provide analog, discrete-time signal-processing capability. This capability is well-suited to performing analog-to-digital conversion using pipeline algorithms, among other applications.

Charge-domain signal-processing circuits are implemented as charge-coupled devices (CCDs), as MOS bucket-brigade devices (BBDs), and as bipolar BBDs. Embodiments of the present invention pertains to MOS and bipolar BBDs.

In differential BBD-based pipelined signal-processing circuits, the signal at each pipeline stage is represented as the difference between a pair of charges, each of which is processed in a separate pipeline. At each stage the charge-pair has a differential-charge component representing the signal, and a common-mode or bias charge component. The differential component is altered at each stage in accordance with the signal-processing algorithm which is being implemented. The common-mode component changes from each stage to the next by a nominally fixed amount, independent of the arriving differential signal charge.

SUMMARY OF THE INVENTION

In a differential BBD-based pipeline it is necessary for proper circuit function to maintain the common-mode charge within an acceptable range at each pipeline stage. In practical implementations of such pipeline circuits, the common-mode charge at later stages of the pipeline typically varies due to variations in fabrication process and in operating conditions such as temperature and supply voltage. These common-mode charge variations can exceed the acceptable range for proper circuit function.

In differential BBD-based pipelined signal-processing circuits which have an input signal, such as A/D converters, the input signal to the pipeline typically contains common-mode components which differ from sample to sample. In addition, sample-to-sample common-mode charge variations can be induced as a side-effect of the intended signal-processing algorithm. These sample-to-sample common-mode charge variations can exceed the acceptable range for proper circuit function in later pipeline stages.

Embodiments of the present invention provides means of reducing common-mode charge variations in a differential charge-domain pipeline. Four aspects of the invention provide correction for various sources of such variation. These aspects include calibration based on sensing common-mode charge in a downstream pipeline stage; replica-based control of common-mode charge; feedback control of common-mode charge based on sensing common-mode charge in a downstream pipeline stage; and feed-forward correction of sample-to-sample common-mode charge variations.

Figure 1:
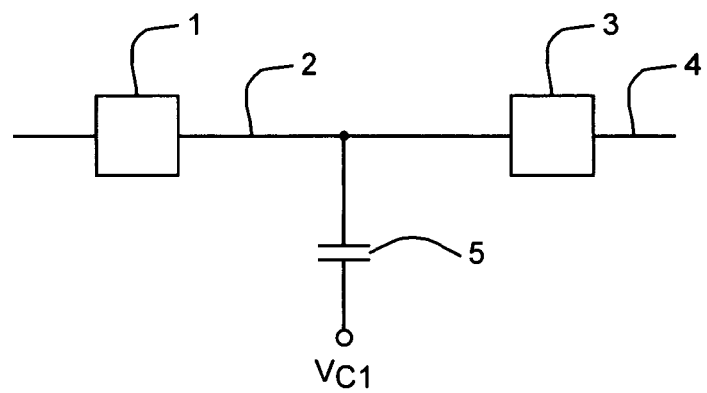
FIG. 1 shows a simplified circuit diagram of a BBD charge-pipeline stage.

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows. The teachings of all patents, published applications and references cited herein are incorporated by reference in their entirety.

In the following description, all circuits are discussed assuming electrons as the signal-charge carriers and NFETs for signal-charge transfer. Equivalent circuits can be applied equally well using holes as charge carriers, by employing PFETs and reversed signal and control voltage polarities. Similar circuits can also be implemented using NPN or PNP bipolar transistors. In the discussion and figures charge-transfer circuits are represented abstractly and some behavioral aspects of these circuits are mentioned, but no details of the operation of such circuits are provided.

In the following discussion the basic operation of BBD charge pipelines is is introduced using a single (non-differential) pipeline example. The principles described however are equally applicable to a differential pipeline as will be explained in detail below.

The basic principle of a BBD pipeline of the general type employed in the preferred embodiment is described with the aid of FIG. 1, which depicts a single stage of such a pipeline. In this stage charge is stored on capacitor 5, which is connected between storage node 2 and voltage $V_{C1}$. Charge enters the stage via charge-transfer circuit 1, and later exits the stage via charge-transfer circuit 3. Voltage $V_{C1}$ is a digital clock signal which controls the timing of charge processing in the stage. Other digital clock signals, not shown, may be used to control the activity of the charge-transfer circuits.

Figure 2:
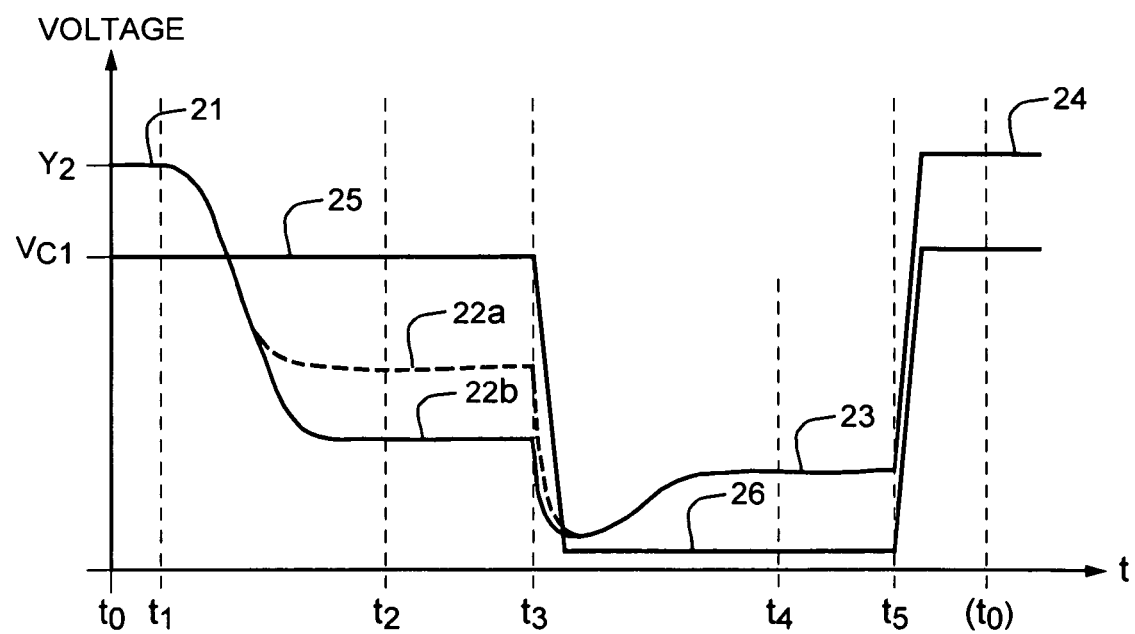
FIG. 2 illustrates voltage waveforms associated with FIG. 1.

Operating waveforms of the pipeline stage are shown in FIG. 2. At time $t_0$ clock voltage $V_{C1}$ has a positive value 25. $V_2$, the voltage of storage-node 2 in FIG. 1, is also at a high initial voltage 21. At $t_1$ negative charge begins to be transferred from the previous stage (to the left of FIG. 1) via charge-transfer circuit 1 into the stage shown. As this negative charge accumulates on capacitor 5, $V_2$ falls to a more negative value. The voltage of node 2 settles to a relatively high value 22A if a relatively small negative charge was transferred; with a larger charge transferred, node 2 settles to a more negative voltage 22B. At time $t_2$ charge transfer into the stage is complete. The voltage of node 2 is related to the charge by the well-known expression Q=CV, where is the total capacitance of node 2. In FIG. 1, C is comprised of $C_5$, the capacitance of capacitor 5, plus any parasitic capacitance of node 2; such parasitic capacitance is usually small and is neglected in this discussion.

Charge transfer out of the stage begins at time $t_3$ when clock voltage $V_{C1}$ switches to a low state. Capacitor 5 couples this voltage transition to node 2, driving $V_2$ low as well. Charge-transfer circuit 3 absorbs charge from capacitor 5, limiting the negative excursion of node 2, and eventually causing node 2 to settle to voltage 23 at $t_4$. Voltage 23 is a characteristic of charge-transfer circuit 3, and is independent of the amount of charge which had been stored on node 2. Charge-transfer circuit 3 transfers the charge absorbed from capacitor 5 to node 4 which is part of the stage following the one shown. After $t_4$ charge transfer is complete.

Finally, at time $t_5$, clock voltage $V_{C1}$ returns to its initial state (voltage 25). Its positive-going transition is coupled to node 2 by capacitor 5, raising node 2 to voltage 24. Neglecting parasitic capacitance, no charge flows onto or off of node 2 during this transition; the voltage change of $V_2$ is therefore equal to the voltage change of $V_{C1}$ during the transition at $t_5$. Since $V_2$'s value at the start of this transition, voltage 23, is independent of charge processed, voltage 24 is likewise independent of charge processed. This transition completes the operating cycle; the resulting voltage 24 at node 2 is thus the initial voltage for the next cycle. Thus the initial voltage state of the stage is constant cycle-to-cycle, and voltage 21=voltage 24. Consequently the initial and final charge on node 2 are also equal, and the charge transferred out is equal to the charge transferred in.

In summary: charge is transferred into the stage shown in FIG. 1 during $t_1$-$t_2$; between times $t_2$ and $t_3$ it is temporarily stored on capacitor 5, and is manifested as the value of $V_2$; during times $t_3$-$t_4$ this charge is completely transferred to the next stage; at $t_5$ the stage returns to its initial state, ready again to receive incoming charge. Thus the basic stage shown acts as a shift register for analog charge packets.

The foregoing description is somewhat idealized; it should be understood that practical circuits depart in many details from this description. Such departures include non-zero parasitic capacitance and imperfect charge transfer, for example. These effects, however, do not change the basic operating principles described above. Certain details of circuit operation, such as clocking of the charge-transfer circuits, are also omitted, as they are not pertinent to the present invention.

In order to form a charge-domain ADC from a pipeline composed of stages similar to FIG. 1, a minimum of two operations in addition to charge storage and shifting are required: charges must be compared to a reference value, typically another charge; and a reference charge must be conditionally added to the signal charge (this 'addition' may be of either sign). In a previous patent application by the same inventor (U.S. Provisional Patent Application No. 60/881,392, filed Jan. 19, 2007, entitled "Charge-Domain Pipelined Analog-to-Digital Converter"; and U.S. patent application Ser. No. 12/009,615, filed Jan. 18, 2008, also entitled "Charge-Domain Pipelined Analog-to-Digital Converter," each of which are incorporated by reference herein), an ADC is disclosed which implements pipelined successive-approximation ADC algorithms using these operations. Other signal-processing applications of BBD pipelines may be implemented using the same operations, or using conditional charge addition without the need for charge comparison.

Embodiments of the present invention provide means of controlling common-mode charge in a differential charge-domain pipelined signal-processing circuit. For purposes of understanding the present invention, charge-comparison operations are not important, and are not discussed further. Conditional charge addition is essential for such understanding, however, and is explained with reference to FIGS. 3 and 4 below.

Figure 3:
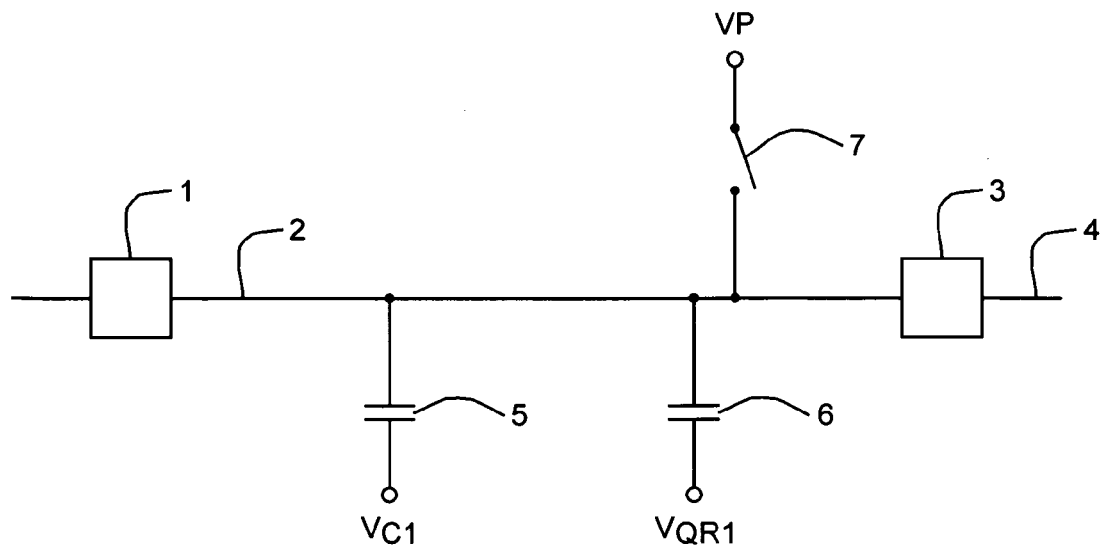
FIG. 3 shows a BBD charge-pipeline stage including conditional charge addition.
Figure 4:
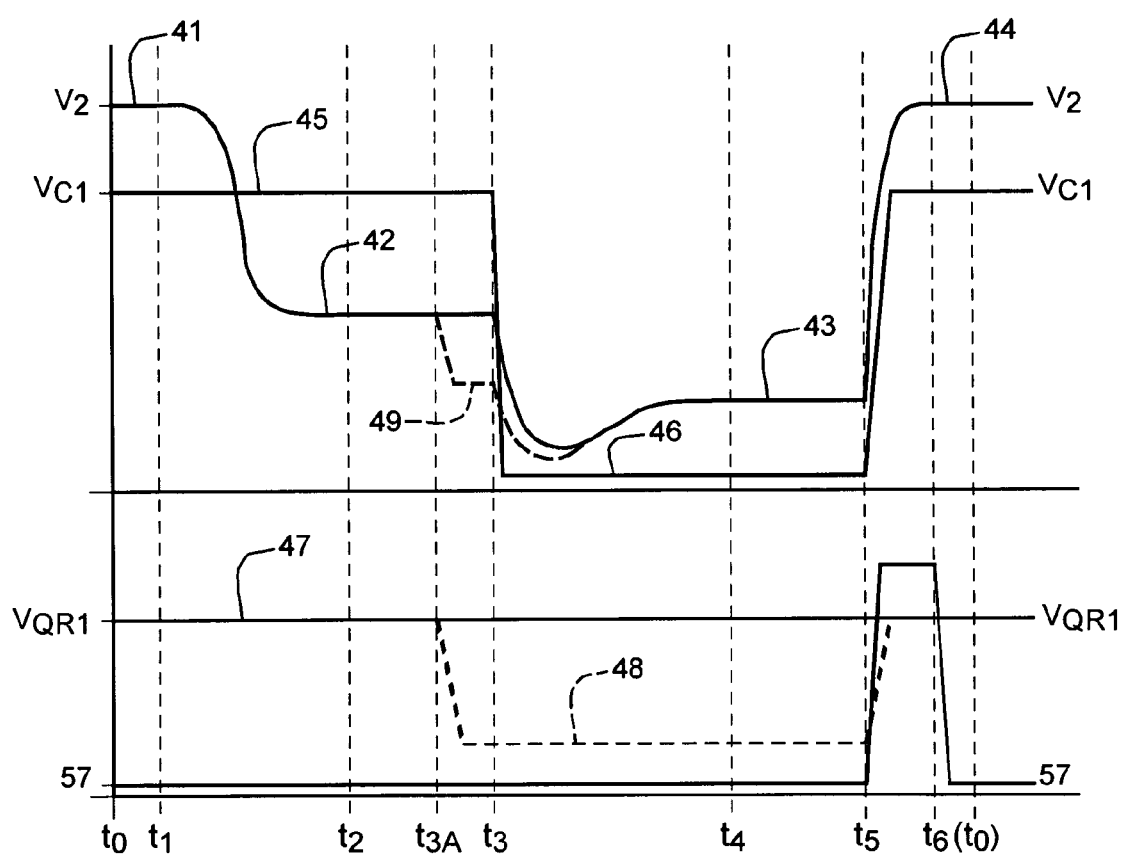
FIG. 4 illustrates voltage waveforms associated with FIG. 3.

The basic principle employed for conditional charge addition is depicted in FIG. 3, with operating waveforms shown in FIG. 4. For the purposes of this discussion, a single-ended stage is shown.

The charge-domain pipeline stage shown in FIG. 3 retains all the elements shown in FIG. 1. In addition, FIG. 3 includes two new elements: capacitor 6 (with value $C_6$) connected between charge-storage node 2 and voltage $V_{QR1}$; and switch 7 connected between node 2 and voltage $V_P$. Switch 7 is controlled by a periodic digital clock signal (identified as $S_7$ in FIG. 4).

FIG. 4 shows the operating waveforms of the circuit of FIG. 3. The initial conditions in FIG. 4 are similar to those in FIG. 2: $V_{C1}$ is at high voltage 45 and $V_2$, the voltage of node 2, is at high voltage 41. In addition, $V_{QR1}$ is at high voltage 47, and switch 7 is in an off state, indicated by the low value of its control signal $S_7$ in FIG. 4. As in FIG. 2, charge is transferred into the stage between $t_1$ and $t_2$, causing $V_2$ to fall in proportion to the incoming charge, settling at voltage 42. The change in $V_2$ due to incoming charge is inversely proportional to the total capacitance of node 2 as explained above. In FIG. 3 (neglecting parasitic capacitance) this total capacitance is $C=C_5+C_6$.

After the charge is transferred in, the new features of FIG. 3 come into play. At time $t_{3A}$ voltage $V_{QR1}$ conditionally switches from its high state 47 to low state 48. This conditional transition of $V_{QR1}$ is coupled via $C_6$ to node 2 where, because of capacitive division, it produces a similar but smaller voltage change. The voltage at node 2 changes to voltage 49 (dashed line) if $V_{QR1}$ switches, and remains at voltage 42 (solid line) if it does not.

At time $t_3$, $V_{C1}$ switches from high voltage 45 to low voltage 46, instigating charge transfer out of the stage. As explained with reference to FIG. 2, node 2 is driven to a lower voltage due to coupling via capacitor 5. Charge-transfer circuit 3 removes charge from node 2 and transfers it to the next stage. By $t_4$ $V_2$ settles to voltage 43 (which is characteristic of the charge-transfer circuit 3 and independent of the charge previously on node 2) and charge transfer out of the stage is complete.

At $t_5$ both $V_{C1}$ and $V_{QR1}$ return to their initial high states (voltages 45 and 47 respectively). This transition is identical for $V_{C1}$ in every clock cycle. $V_{QR1}$, however, may already be at its high voltage 47, depending on whether or not it switched at $t_{3A}$. Thus the positive step coupled to node 2 at $t_5$ can have different values, depending on the state of $V_{QR1}$, resulting in a different final voltage. The added switch 7 in FIG. 3 is used to restore the voltage (and charge) on node 2 to a repeatable state regardless of the state of $V_{QR1}$ at $t_5$. Switch 7 is turned on, as indicated by the high state of its control signal S7, during $t_5$-$t_6$, thus establishing a repeatable voltage at node 2 to begin the next cycle, so voltage 44=voltage 41. With an ideal switch, voltage 44=$V_P$; practical MOS switches introduce a small 'pedestal' so that voltage 44≠$V_P$. This non-ideality is, however, repeatable cycle-to-cycle, so the voltage 44=voltage 41 condition is still met in practical circuits.

Unlike the case of FIG. 1 where the charge transferred into the stage was subsequently transferred out without alteration, the outgoing charge in the circuit of FIG. 3 differs in general from the incoming charge:

$$Q_{OUT}=Q_{IN}+C_6\Delta V_{QR1}+Q_{CONST} \quad \text{Equation 1}$$

where $C_6$ is the capacitance of capacitor 6, $\Delta V_{QR1}$ is the change in $V_{QR1}$ at $t_{3A}$, and $Q_{CONST}$ is given by:

$$Q_{CONST}=(C_5+C_6)(\text{voltage 41}-\text{voltage 43})+C_5(\text{voltage 46}-\text{voltage 45}) \quad \text{Equation 1A}$$

$Q_{CONST}$ is nominally a fixed charge, since voltages 41, 43, 45, and 46 are all ideally constant. In practical circuits, the voltages in Equation 1A are typically dependent on fabrication process, and also vary slowly due to changes in operating conditions such as temperature.

As is apparent in FIG. 4, $\Delta V_{QR1}$ is equal to (voltage 48−voltage 47) if $V_{QR1}$ switches, and is equal to zero if it does not. Note that both charge quantities $C_6\Delta V_{QR1}$ and $Q_{CONST}$ can be made either positive or negative by appropriate choices of the various voltages.

When the circuit of FIG. 3 is used to form one stage of a pipelined ADC, the quantity (voltage 48−voltage 47) is made equal to a reference voltage; for convenience it will be called $V_{R1}$. Correspondingly, the quantity $C_6V_{R1}$ becomes a reference charge, since $C_6$ is fixed in a given instantiation. Thus the conditional choice of $\Delta V_{QR1}=V_{R1}$ or $\Delta V_{QR1}=0$ at $t_{3A}$ corresponds in Equation 1 to the conditional addition of a reference charge $C_6V_{R1}$ to the incoming charge packet $Q_{IN}$. The circuit of FIG. 3 thus provides the conditional reference-charge addition which was identified above as an essential operation for charge-domain ADC implementation.

Figure 5:
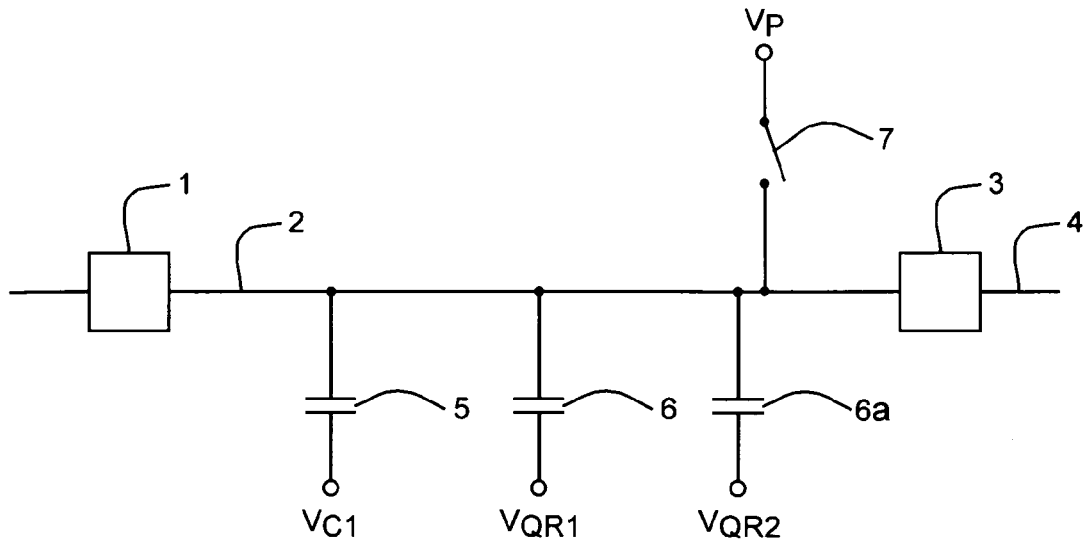
FIG. 5 shows a BBD charge-pipeline stage including conditional charge addition, with the added charge composed of two independent components.

In some signal-processing implementations it is desirable to provide more than one conditional charge addition in a single pipeline stage. An example of such a stage is shown in FIG. 5. This circuit includes, in addition to the elements in FIG. 3, additional capacitor 6A and voltage source $V_{QR2}$. The operation of such a stage is identical to that of FIG. 3, except that at $t_{3A}$ each of the voltages $V_{QR1}$ and $V_{QR2}$ undergoes an independent conditional transition, of size $V_{R1}$ (or zero) and $V_{R2}$ (or zero) respectively. The resulting charge transfer function of the stage is given by:

$$Q_{OUT}=Q_{IN}+C_6\Delta V_{QR1}+C_{6A}\Delta V_{QR2}+Q_{CONST2} \quad \text{Equation 2}$$

where $Q_{CONST2}$ is given by:

$$Q_{CONST2}=(C_5+C_6+C_{6A})(\text{voltage 41}-\text{voltage 43})+C_5(\text{voltage 46}-\text{voltage 45}) \quad \text{Equation 2A}$$

The same principle can be extended to any number of capacitors and $V_R$ values. For simplicity Equations 1 and 1A will be used as the basis for the following discussion. The principles described are equally applicable to circuits with more than one conditionally-switched capacitor, as in FIG. 5.

Figure 6:
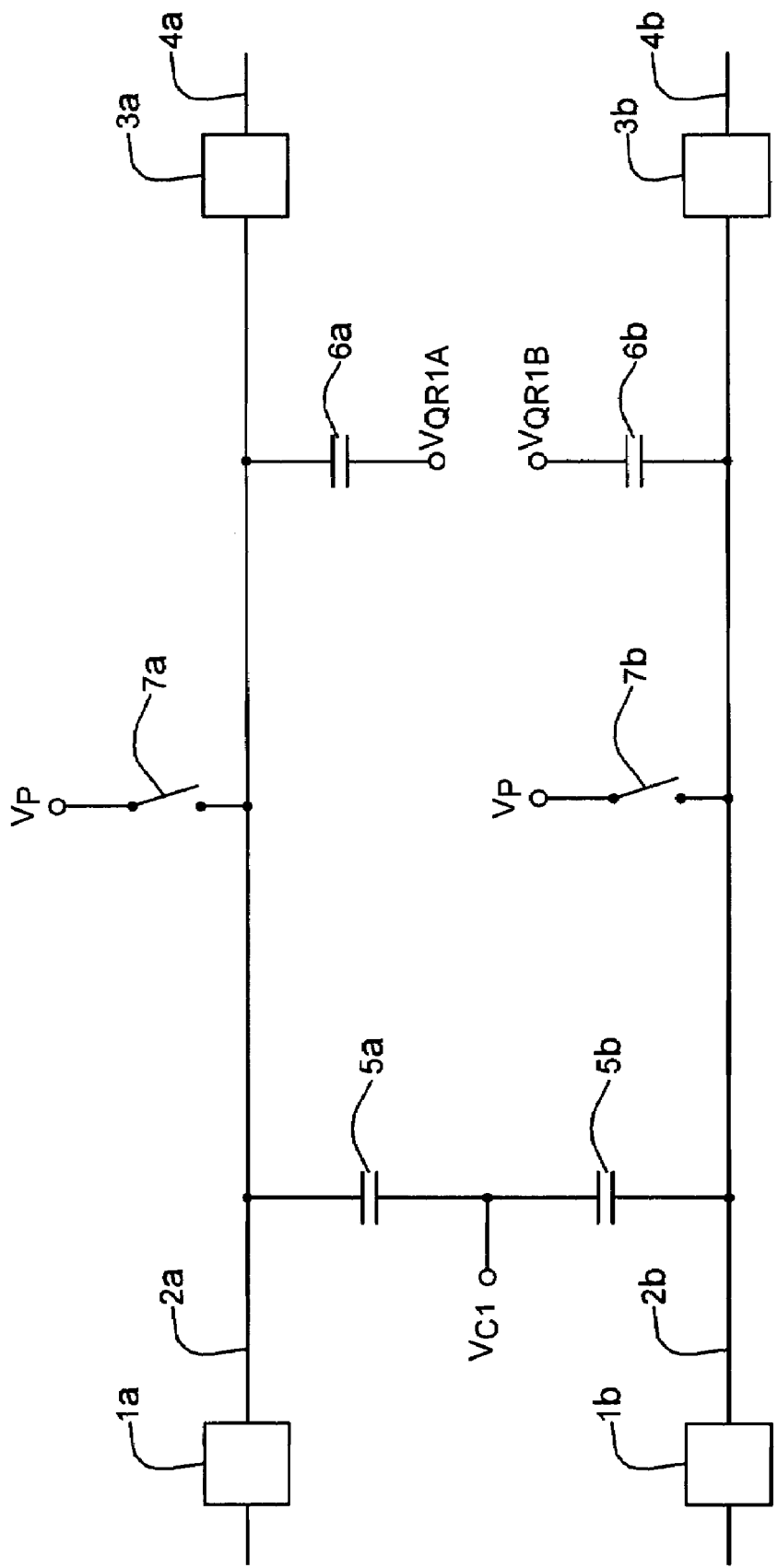
FIG. 6 shows a differential BBD charge-pipeline stage including conditional charge addition.

The extension of the concepts described above to a differential pipeline can be understood with reference to FIG. 6, which illustrates a differential pipeline stage composed of two single-ended stages like that of FIG. 3. The upper ('A') circuit consists of charge-transfer circuits 1A and 3A, storage node 2A, capacitors 5A and 6A, switch 7A and output node 4A, all identified by analogy with FIG. 3. The lower ('B') circuit likewise consists of charge-transfer circuits 1B and 3B, storage node 2B capacitors 5B and 6B, switch 7B and output node 4B. The clock voltage $V_{C1}$ is shared by the A and B circuits, which operate simultaneously with timing as shown in FIG. 4. The conditionally-switched voltages $V_{QR1A}$ and $V_{QR1B}$ are constrained such that in any one clock cycle either $V_{QR1A}$ or $V_{QR1B}$, but not both, switches from a high state to a low state as shown for $V_{QR1}$ in FIG. 4. This combination of A and B circuits to form a differential pipeline stage with the indicated timing is consistent with the ADC of the previously-referenced invention and with other signal-processing applications.

As a result of these operating conditions, the A and B circuits in FIG. 6 each process charge in accordance Equation 1, with only the value of $V_{QR1}$ differing. The resulting charge transfer functions are:

$$Q_{OUTA}=Q_{INA}+C_6\Delta V_{QR1A}+Q_{CONST} \quad \text{Equation 3A}$$

$$Q_{OUTB}=Q_{INB}+C_6\Delta V_{QR1B}+Q_{CONST} \quad \text{Equation 3B}$$

where it is assumed for simplicity that the values of capacitors 6A and 6B are both equal to $C_6$. The constraint given above on switching of $V_{QR1A}$ and $V_{QR1B}$ can be re-stated as:
either $\{\Delta V_{QR1A}=V_{R1}$ and $\Delta V_{QR1B}=0\}$ or $\{\Delta V_{QR1A}=0$ and $\Delta V_{QR1B}=V_{R1}\}$ We assign a binary variable b to the either-or choice just described: b=1 indicates the first case and b=0 the second. With this definition, we can re-write equations 3A and 3B as:

$$Q_{OUTA}=Q_{INA}+bC_6V_{R1}+Q_{CONST} \quad \text{Equation 4A}$$

$$Q_{OUTB}=Q_{INB}+(1-b)C_6V_{R1}+Q_{CONST} \quad \text{Equation 4B}$$

In the differential pipeline configuration, the (differential) signal is represented by the difference between the "A" charge and the "B" charge: $Q=Q_A-Q_B$. Thus Equations 4A and 4B may be combined to express the stage transfer function for differential signal charge:

$$Q_{OUT}=Q_{IN}+(2b-1)C_6V_{R1} \quad \text{Equation 5}$$

Similarly, the common-mode (CM) charge in the differential configuration is equal to the average of the "A" and "B" charges: $Q_{CM}=\frac{1}{2}(Q_A+Q_B)$. Using this definition, we can combine Equations 4A and 4B to obtain:

$$\begin{aligned}Q_{CM\text{-}OUT} &= 1/2(Q_{OUTA}+Q_{OUTB}) \\ &= 1/2[(Q_{INA}+bC_6V_{R1}+Q_{CONST})+ \\ &\quad (Q_{INB}+(1-b)C_6V_{R1}+Q_{CONST})] \\ &= 1/2(Q_{INA}+Q_{INB})+ \\ &\quad 1/2 C_6V_{R1}+Q_{CONST} \\ &= Q_{CM\text{-}IN}+1/2 C_6V_{R1}+Q_{CONST}\end{aligned} \quad \text{Equation 6}$$

Equation 6 indicates how the CM charge changes from input to output of a given pipeline stage. Note that both components of the change, $\frac{1}{2}C_6V_{R1}$ and $Q_{CONST}$, are nominally constant values. In practical circuits, however, as explained in the discussion of Equation 1A, $Q_{CONST}$ is somewhat variable, depending both on fabrication process and circuit operating conditions. Typically the reference voltage $V_{R1}$ also exhibits similar, but usually smaller, variations. One object of the present invention is control of the effects of these variations in $Q_{CONST}$ and $V_{R1}$ in order to assure proper circuit operation.

Like the signal propagated from stage to stage of a charge-domain pipeline, the input signal to such a pipeline is also composed of differential and common-mode charge components. In an ADC implemented using a charge-domain pipeline, for example, such an input signal might be provided by a sample-and-hold circuit. The CM charge output of such a circuit is typically subject to variations due to process and operating conditions, for reasons similar to those discussed above. Moreover, not only the differential component, but also the CM charge component of each sample from such a source may have a distinct value. This sample-to-sample variation of CM charge can arise both from the input signal itself and from the behavior of the input circuit. The result is a CM charge input to the pipeline which varies at the clock rate of the pipeline.

For proper operation of a charge-domain pipeline, it is essential to assure that the common-mode charge input to each stage is constrained within a limited range. For this reason, it is desirable in a charge-domain pipeline to provide means of reducing the effects of the variability discussed above. In the following discussion, four means of accomplishing such reduction are disclosed.

First, a combination of CM charge sensing and digital adjustment of the pipeline input circuitry provides a means of reducing the effects of fabrication-process variation. Second, a replica-based circuit provides a means of correcting for variation of $Q_{CONST}$ with process and operating conditions. Third, a combination of CM charge sensing and feedback correction to an earlier pipeline stage provides means of further reducing the effects of changes in temperature and other operating conditions. Fourth, a combination of CM charge sensing and feed-forward correction provides means of reducing the effect of sample-to-sample CM charge variations. These several means of controlling CM charge variation can advantageously be used in combination; an example of such a combination is discussed following the descriptions of the individual means.

Each of these means operates by altering CM charge output from one or more pipeline stages. Changing the $Q_{CONST}$ term in Equation 6 provides a practical means of producing such an alteration. Equation 1A shows that $Q_{CONST}$ depends on four voltages (41, 43, 45 and 46 in FIG. 4). Alteration of any one, or any combination, of these voltages causes a change in $Q_{CONST}$. Details of the means of altering such voltages depend on specific circuit implementations of the pipeline stages, and are not pertinent to the present invention; they are not discussed further.

Figure 7:
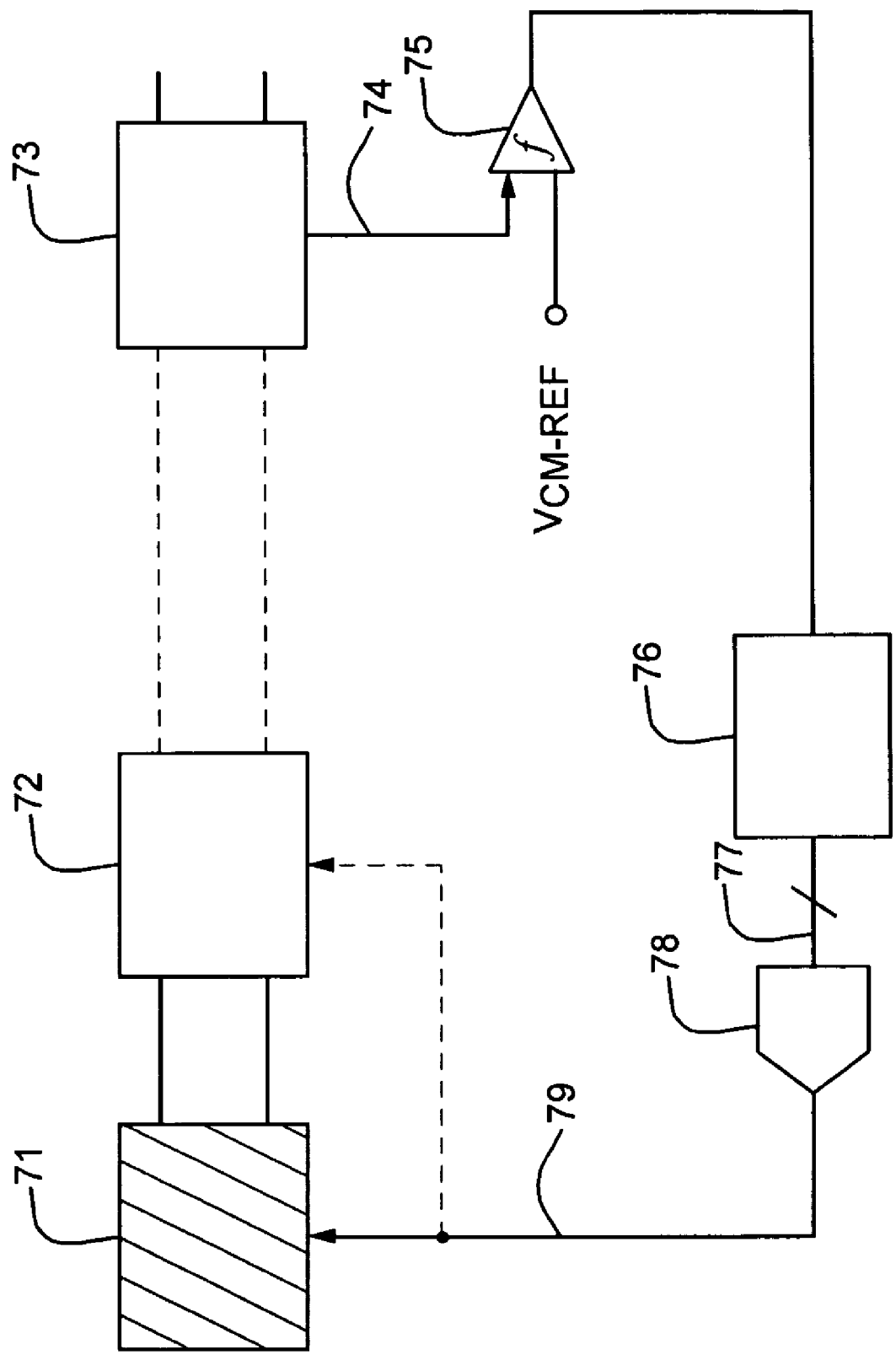
FIG. 7 shows a differential BBD charge-pipeline segment with an input circuit and digital common-mode charge correction.

FIG. 7 illustrates an embodiment of the first aspect of this invention, which provides means of reducing the effect of fabrication-process variation on CM charge. FIG. 7 shows a differential charge-domain pipeline segment comprised of two stages, 72 and 73, each similar to the stage shown in FIG. 6. (As indicated by the dashed lines connecting stages 72 and 73, additional stages could be included in the pipeline segment. Additional stages could be appended after stage 73 as well.) Stage 72 is supplied with input charge by an input circuit 71. The final stage in the segment, 73, provides a voltage output 74 which indicates the amount of CM charge present in stage 73. Comparator 75 compares this output with a reference voltage $V_{CM-REF}$. The output of comparator 75 is sampled and processed in logic block 76, whose digital output 77 drives digital-to-analog converter (DAC) 78, providing control voltage 79. This voltage is supplied as a control input to pipeline input circuit 71. Alternatively, control voltage 79 can be supplied as a control input to first pipeline stage 72, as indicated by the dashed arrow.

The operation of the circuit of FIG. 7 is as follows. Logic block 76 supplies some initial digital value at its output 77, which is received as input to DAC 78. DAC 78 provides an analog voltage 79 responsive to its digital input 77. Voltage 79 is supplied to input circuit 71, where it acts to control the CM output charge of circuit 71. This CM charge, together with any CM charge added by pipeline stage 72, arrives at stage 73. In stage 73 the CM charge value is sensed, resulting in an approximately proportional voltage 74 which is supplied as an input to comparator 75. Comparator 75 compares this voltage to reference voltage $V_{CM-REF}$, and provides a digital signal representing the result of this comparison to logic block 76. If this digital signal indicates that the CM charge in stage 73 is too low, then logic block 76 changes its output 77 (and consequently DAC 78's output 79) to cause the CM charge output of circuit 71 to increase. Conversely, if the comparator indicates that CM charge in stage 73 is too high, logic block 76 changes its output to bring about a reduction in stage 71's CM charge output.

After a delay to allow the change in CM charge to propagate through the pipeline from stage 71 to stage 73, this adjustment process is repeated. Iterating this adjustment-plus-delay process using any of various well-known algorithms, including successive-approximation and linear-ramp algorithms, causes the digital signal 77 to converge to a value such that the CM charge reaching stage 73 is near its target value (as defined by $V_{CM-REF}$). Details of operation such as iteration delay, adjustment algorithm, etc. are governed by the design of logic block 76, which may be implemented as a state machine, microprocessor, or other well-known logic structure. Such details of implementation are not pertinent to the present invention.

The CM-adjustment process just described can be performed, for example, upon powering-up the pipeline circuitry. It can optionally be repeated at any time during circuit operation when a suitable input signal is available. After each such execution of the CM-adjustment process, the digital value 77 is stored in a digital register and presented continuously to DAC 78, thus maintaining the final (converged) CM value until another adjustment is executed. Alternatively, this CM-adjustment process can be carried out during manufacturing test of the circuit, with the resulting digital value 77 being stored in a non-volatile memory which is also part of the circuit, thus providing permanent correction for process-induced CM variation.

The adjustment circuitry and procedure just described adjust the CM charge output of input circuit 71 such that the CM charge received at pipeline stage 73 is near a target value. The CM charge at stage 73 is also affected by intervening pipeline stages, such as 72 in FIG. 7. Thus the adjustment described in fact removes not only CM charge variations in the output of input circuit 71, but also variations in CM charge added by the intervening pipeline stages.

Since the charge output of input circuit 71 traverses pipeline stage 72, the adjustment voltage 79 can alternatively be applied to stage 72, as indicated by the dashed arrow in FIG. 7. Such an adjustment varies the value of $Q_{CONST}$ of that stage, thus effecting the desired result. Similarly this adjustment can be applied at later pipeline stages, provided that the earlier stages can accommodate the un-adjusted CM charge variation.

Figure 8:
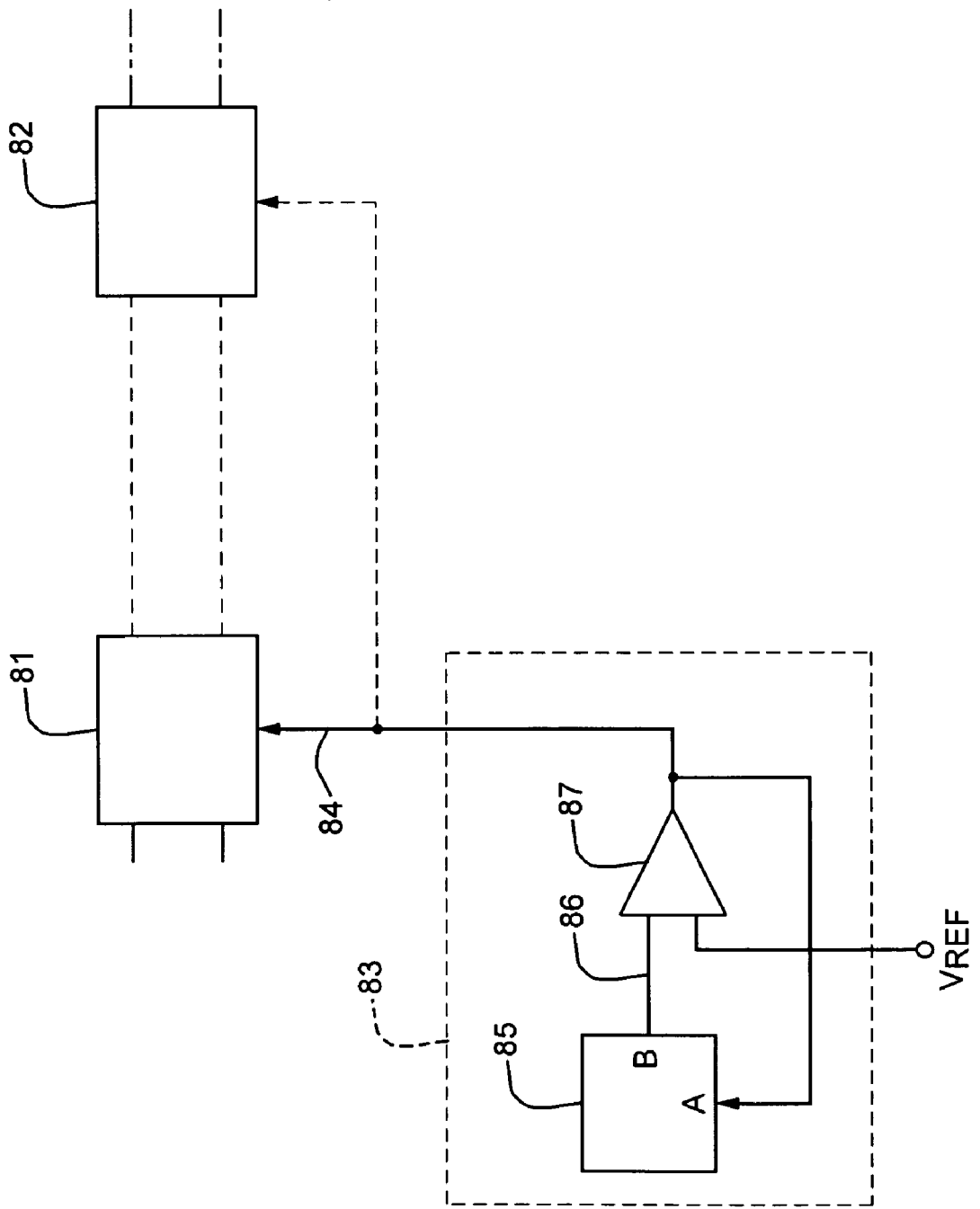
FIG. 8 shows a differential BBD charge-pipeline segment with replica-based common-mode charge correction.

FIG. 8 illustrates an embodiment of the second aspect of the present invention, which provides a means of correcting for CM charge variations due to fabrication process and operating conditions. FIG. 8 shows a pipeline segment consisting of pipeline stages 81 and 82, each similar to the stage of FIG. 6. (As indicated by the dashed lines connecting stages 81 and 82, additional stages could be included in the pipeline segment. Additional stages could be appended after stage 82 as well.) A control circuit 83 is supplied with a reference voltage $V_{REF}$ and provides an analog control signal 84 to each pipeline stage. Control circuit 83 includes circuit 85, which is a replica of the charge-transfer circuits used in pipeline stages 81 and 82, and which provides analog output 86; and an operational amplifier 87.

Control circuit 83 employs a version of a replica-circuit technique to derive the control signal 84. Replica charge-transfer circuit 85 is biased statically to replicate its operating conditions near the end of a charge-transfer cycle, e.g., near time $t_4$ in FIG. 4. (An example of such biasing is given in FIG. 9.) One of the voltages associated with replica charge-transfer circuit 85 is presented at its output port 'B' as voltage 86. Op-amp 87 amplifies the difference between voltage 86 and reference voltage $V_{REF}$, supplying the amplified output as voltage 84 to control port 'A' of replica circuit 85. Due to feedback, op-amp 87 drives voltage 84 to a value that results in replica-circuit output 86 becoming nearly equal to reference voltage $V_{REF}$. Output voltage 84 is simultaneously supplied to control ports, equivalent to port 'A' on replica circuit 85, in each charge-transfer circuit in pipeline stages 81 and 82. Consequently the equivalent in each charge-transfer circuit of voltage 86 is driven to be nearly equal to the target voltage $V_{REF}$.

This replica-circuit technique provides a means of controlling a particular target voltage which occurs in each charge-transfer stage and in the replica circuit. For example, consider voltage 43 in FIG. 4. As was explained in connection with that figure, voltage 43 is a characteristic of the charge-transfer circuit: it is the voltage to which the charge-transfer circuit's input settles as charge-transfer comes to an end. As shown in Equation 1A, it is one of the voltages which affects $Q_{CONST}$, which in turn, according to Equation 6, affects the change in CM charge imposed by a pipeline stage. In typical BBD-based charge-domain pipeline circuits, voltage 43 is the most process- and temperature-dependent voltage involved in a pipeline stage's operation. Thus controlling it would provide a means of reducing the dependence of CM charge on process and temperature.

Figure 9:
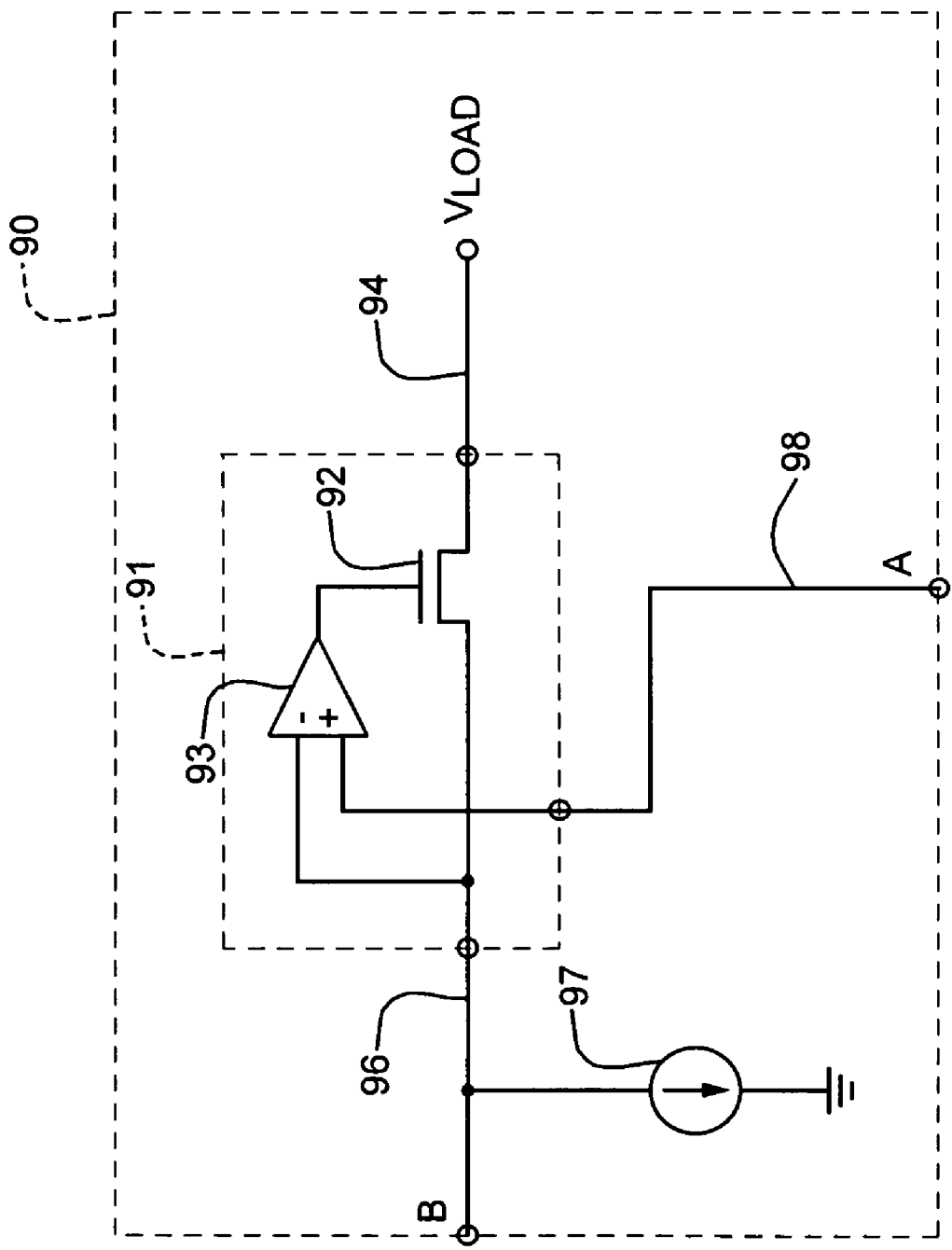
FIG. 9 shows some details of a replica charge-transfer circuit useful for common-mode charge correction.

FIG. 9 shows an example of a replica charge-transfer circuit 90 which is suitable for use as circuit 85 in FIG. 8. It illustrates the control of voltage 43 by an externally-supplied control voltage, consistent with the circuit of FIG. 8. Replica circuit 90 includes a charge-transfer circuit 91, consisting of FET 92 and amplifier 93, with input node 96, output node 94 and control node 98. (This circuit is an example of a class of charge-transfer circuits disclosed in a previous patent application by the same inventor, "Boosted Charge-Transfer Pipeline," U.S. patent application Ser. No. 11/807,914, filed May 30, 2007, which is hereby incorporated by reference in its entirety, and which provides details of its operation. The circuit's behavior during charge-transfer is consistent with FIG. 4.) Output node 94 is connected to DC voltage $V_{LOAD}$.

Input node 96 is connected to current source 97 and to port 'B' of circuit 90. Control node 98 is connected to port 'A' of circuit 90.

Current source 97 is configured to sink from node 96 a small current which is typical of current levels near the end of the charge-transfer process described above. DC voltage $V_{LOAD}$ has a value in the range normally occurring at the output of the charge-transfer circuit at the end of the charge transfer process (such as voltage 42 in FIG. 4). Thus charge-transfer circuit 91 is biased statically in a condition which is similar to the instantaneous condition in a charge-transfer circuit in the pipeline near the end of the normal (clocked) charge-transfer process. The voltage at input node 96 of the charge-transfer circuit in this condition is approximately equal to voltage 43 in FIG. 4, which is the target for control by the circuit of FIG. 8 as discussed above. This same voltage is provided at port 'B' of the replica circuit. The voltage supplied at port 'A' is applied as a reference input to amplifier 93. Amplifier 93 drives FET 92 such that the voltage at port 'B' changes in response to the voltage provided at port 'A'. This sensitivity of port 'B' voltage to port 'A' voltage provides the desired controllability.

The essential principle disclosed in the foregoing description is the control of a charge-transfer circuit parameter, which affects CM charge alteration in a charge-domain pipeline stage, by means of a control voltage derived using a DC-biased replica of the charge-transfer circuit. This principle can be applied to a variety of charge-transfer circuits, and to the control of various parameters of the circuit which have the aforementioned effect on CM charge.

In some charge-domain pipelines, not all stages use the same charge-transfer circuit design. In such cases, a separate replica-based control circuit, like circuit 83 in FIG. 8, can be used for each separate charge-transfer circuit type employed. In each such control circuit the replica circuit, equivalent to 85 in FIG. 8, is of the same design as the actual charge-transfer circuits controlled by that control circuit.

Unlike the digital adjustment described first above, the replica-based circuit technique just described is capable of correcting not only CM charge variations due to fabrication-process variations, but also variations due to changes in temperature and other circuit operating conditions: it provides continuous, on-going correction as long as the circuit is operating. However, the use of a replica-based method is subject to inaccuracies which result from device mismatch between the replica circuit and the various charge-transfer circuits in the pipeline. For this reason, the replica-based circuit described above is best used in combination with other aspects of the present invention.

Figure 10:
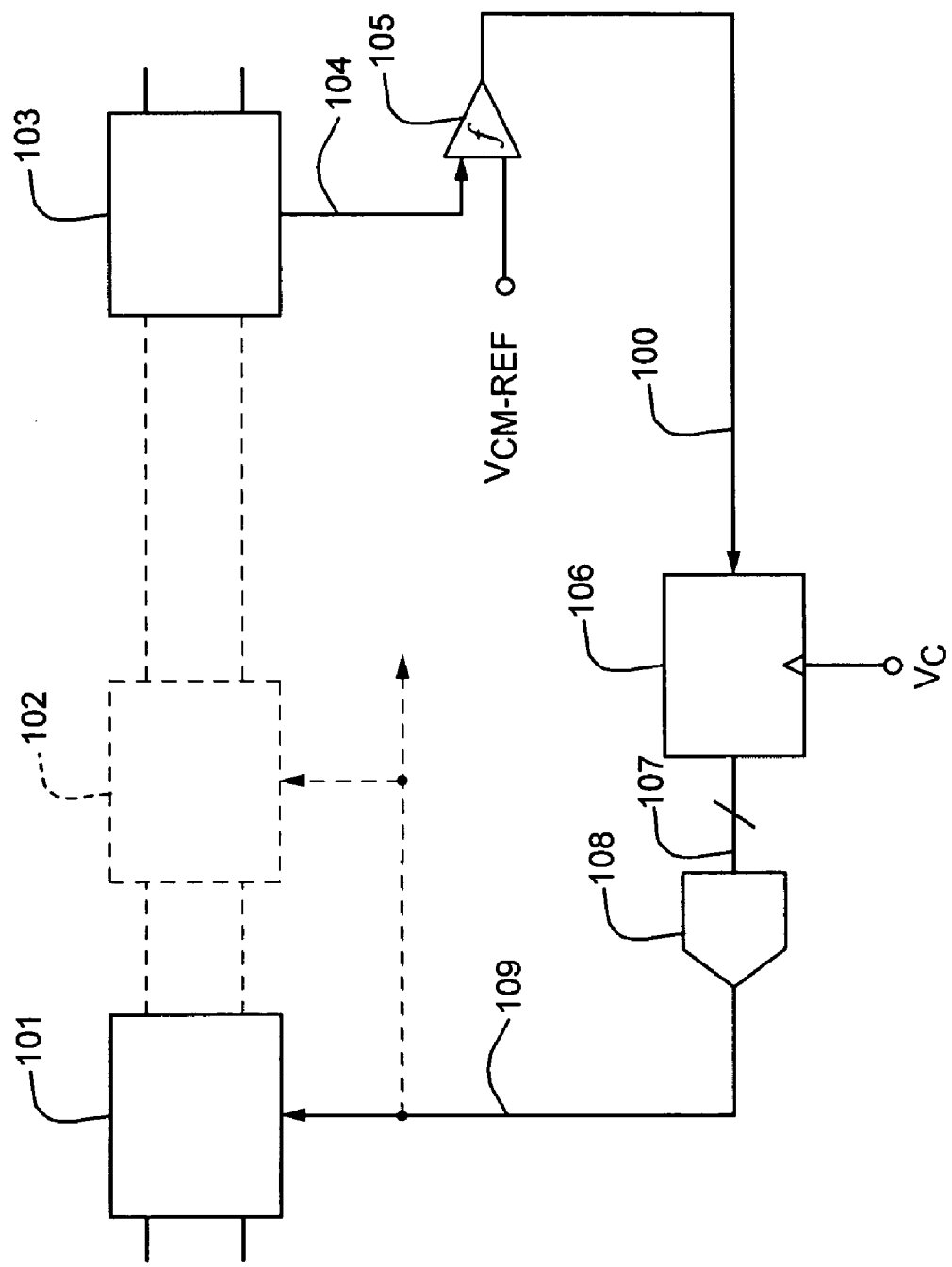
FIG. 10 shows a feedback circuit for controlling common-mode charge, based on sensing common-mode charge in a downstream pipeline stage.

FIG. 10 illustrates an embodiment of the third aspect of the present invention, which provides a means of correcting for CM charge variations due to changes in operating conditions. Because it used feedback and does not depend on device matching in charge-transfer circuits, it is inherently more precise than the replica-based correction means described above.

FIG. 10 shows a differential charge-domain pipeline segment comprised of two stages, 101 and 103, each similar to the stage shown in FIG. 6. Additional pipeline stages may be included in the pipeline segment, as indicated by the dashed signals and the dashed stage 102. (Additional stages could be appended after stage 103 as well.) The final stage in the pipeline segment, 103, provides a voltage output 104 which indicates the amount of CM charge present in stage 103. Comparator 105 compares this output with a reference voltage $V_{CM-REF}$. The output of comparator 105, digital signal 100, is provided as input to up-down counter 106, which is clocked by the clock signal $V_C$. The digital output 107 of up-down counter 106 drives DAC 108, whose analog output is voltage 109. This voltage is supplied as a control input to pipeline stage 101. Control voltage 109 affects the $Q_{CONST}$ term (see Equation 6) in the CM-charge transfer function of stage 101. Optionally, voltage 109 can be supplied as a control input to additional pipeline stages as indicated by the dashed arrows.

The operation of the circuit of FIG. 10 is as follows. Up-down counter 106 supplies some initial digital value at its output 107, which is received as input to DAC 108. DAC 108 provides an analog voltage 109 responsive to its digital input 107. Voltage 109 is supplied to pipeline stage 101, where it acts to control the CM output charge of stage 101. This CM charge, together with any CM charge added by pipeline stage 102 and any intervening stages, arrives at stage 103. In stage 103 the CM charge value is sensed, resulting in an approximately proportional voltage 104 which is supplied as an input to comparator 105. Comparator 105 compares this voltage to reference voltage $V_{CM-REF}$, and provides a digital signal 100, representing the result of this comparison, to up-down counter 106. If this digital signal indicates that the CM charge in stage 103 is too low, then up-down counter 106 changes its output 107 (and consequently DAC 108's output 109) to cause the CM charge output of circuit 101 to increase. Conversely, if the comparator indicates that CM charge in stage 103 is too high, up-down counter 106 changes its output to bring about a reduction in stage 101's CM charge output.

Up-down counter 106 increments its digital output at each cycle of its clock $V_C$, with the direction of the increment (increase or decrease) determined by the state of comparator output 100. Provided that the period of the clock signal $V_C$ is large enough for the change in stage 101's CM output charge to propagate to stage 103, then the negative feedback process just described is stable, and converges to a final state in which the CM charge at stage 103 is near its target value (set by $V_{CM-REF}$). Once this equilibrium is reached, up-down counter 106 'dithers' ±1 bit around its equilibrium value. (If the noise of the CM-charge-sensing circuitry is large, this dither value may be larger than ±1 bit.) Thus the circuit of FIG. 10 acts to drive the analog control signal 109 to a value such that CM charge in the final pipeline stage 103 is near its target value.

An important property of this circuit is that it is capable of tracking and correcting for changes in the CM-charge transfer function of the controlled pipeline stages caused by changes in temperature and other operating conditions. This capability is due to the fact that the described circuit does not require any particular test signals at the pipeline input, so it can remain in operation continuously as long as the overall charge-pipeline circuit operates.

The essential principle disclosed in the foregoing description is the control of a charge-transfer circuit parameter, which affects CM charge alteration in a charge-domain pipeline stage, by means of a control voltage derived by feedback from CM-charge sensing in a later pipeline stage. Circuit details, such as the number of bits of digital signal 107, the choice of the frequency of clock signal $V_C$, etc., affect performance of this circuit. Such details are not essential to understanding of the circuit disclosed, and are not described further.

Figure 11:
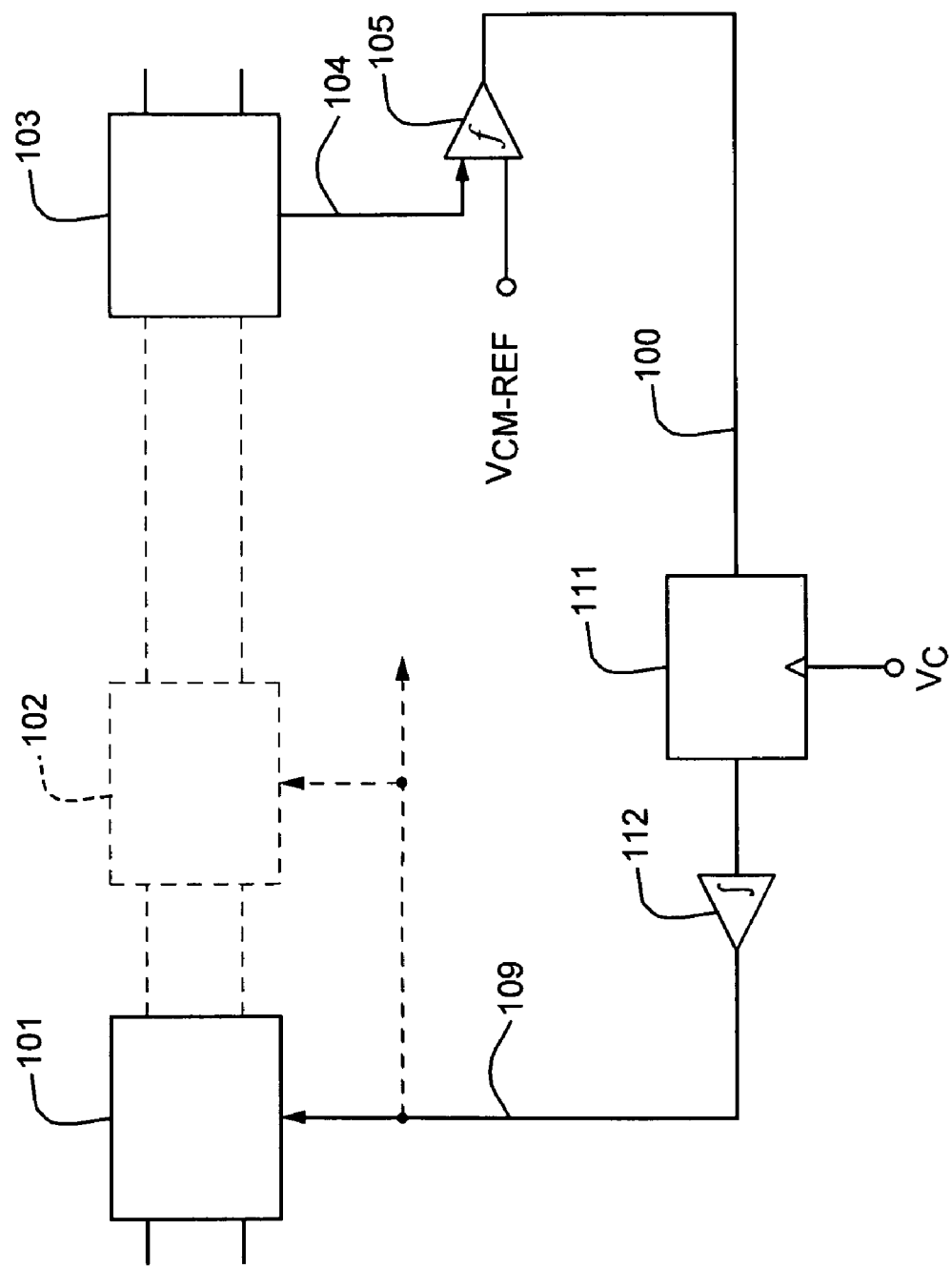
FIG. 11 shows an alternative implementation of a feedback circuit for controlling common-mode charge based on sensing common-mode charge in a downstream pipeline stage.

An alternative implementation of the same circuit principle is shown in FIG. 11. The circuit of FIG. 11 is identical to that of FIG. 10 except that up-down counter 106 and DAC 108 are replaced by charge-pump 111 and integrator 112. At each clock cycle of $V_C$, charge-pump 111 supplies a small increment of charge to integrator 112, the sign of the charge increment being determined by the value of comparator output 100. The integrator responds to the charge increment by stepping its output voltage 109 up or down by a small amount. Thus the response of control voltage 109 to comparator output 100 and clock signal $V_C$ is essentially identical to the response in FIG. 10, and overall circuit operation is equivalent.

The three circuit techniques so far described provide correction of initial (process-dependent) and slowly-varying (operating-condition dependent) CM charge variations. The CM charge in a charge-domain pipeline circuit such as an ADC typically also exhibits components which vary at a sample-to-sample rate, which the foregoing circuits cannot remove. Such components may arise from both the input signal itself and from the behavior of the input stage to the charge-domain pipeline. Moreover, in a pipelined charge-domain ADC, capacitor mismatches in a given stage may give rise to CM variations in that stage's output charge which are a function of the bit decisions made in that stage, so are also variable at a sample-to-sample rate.

Figure 12:
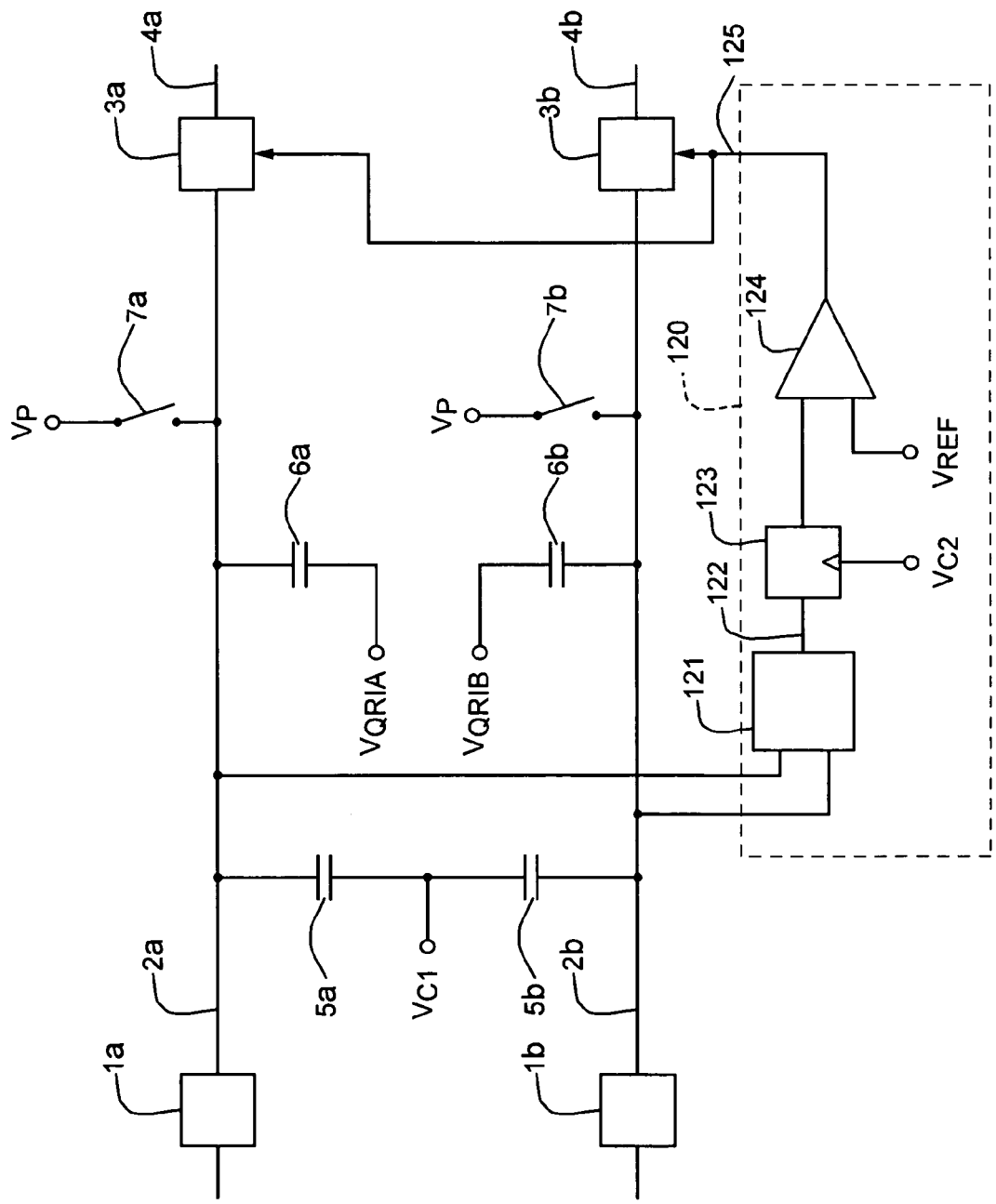
FIG. 12 shows a feed-forward circuit for correcting for sample-to-sample common-mode charge variation.

FIG. 12 illustrates an embodiment of the fourth aspect of the present invention, which provides a means of correcting for sample-to-sample CM charge variations. FIG. 12 includes the differential charge-pipeline stage shown in FIG. 6 with the same identification of elements. In addition it includes common-mode feed-forward circuit 120. Circuit 120 is comprised of sensing circuit 121 with output voltage 122; sample-and-hold circuit 123 controlled by clock signal $V_{C2}$; and amplifier 124. Amplifier 124 provides an amplified version of the difference between the output of sample-and-hold circuit 123 and reference voltage $V_{REF}$ as its output signal 125. Signal 125 is supplied to charge-transfer circuits 3A and 3B as a control signal which alters $Q_{CONST}$ in the charge-transfer functions of those circuits (see Equation 6).

The operating waveforms of the circuit of FIG. 6 have been discussed above: each of the two ('A' and 'B') single-ended pipeline stages comprising the differential pipeline stage operates as shown in FIG. 4. The circuit elements reproduced in FIG. 10 from FIG. 6 operate in the same manner. Referring to FIG. 4, voltage $V_2$ is the voltage of a charge-storage node (node 2A or 2B). After charge-transfer into the stage (i.e., at $t_2$ in FIG. 4) each of these nodes settles at a voltage, such as voltage 42 in FIG. 4, which depends on the charge input to that node. The input common-mode charge to the stage is defined as the average of the two incoming charges (see the discussion of Equations 5 and 6). Thus the average of the two node voltages in the differential stage at $t_2$ has the same dependence on common-mode charge as the individual node voltages do on the individual charges. This average voltage thus provides an indication of common-mode input charge to the stage.

Common-mode sensing circuit 121 senses the two node voltages (at nodes 2A and 2B) and provides a voltage 122 which is proportional to their average. Sample-and-hold circuit 123 receives this voltage, captures its value at approximately $t_2$, and provides the captured voltage to amplifier 124. This voltage is held constant at least until the completion of charge-transfer out of the stage at $t_5$.

The characteristics of sensor 121 and sample-and-hold circuit 123 are so designed that if the common-mode charge received by the pipeline stage equals its target value, then the output of sample-and-hold stage 123 is equal to $V_{REF}$, and the amplifier output 125 makes no alteration in the $Q_{CONST}$ of the stage. If the common-mode charge received by the stage differs from its target value, then the sample-and-hold circuit output differs from $V_{REF}$, causing amplifier output 125 to take on a value which alters $Q_{CONST}$ of the stage. Ideally, the behavior of the circuit of FIG. 10 is such that:

$$Q_{CONST} = Q_{CONST(NOMINAL)} - (Q_{CM-IN} - Q_{CM-TARGET}) \quad \text{Equation 7}$$

where $Q_{CONST(NOMINAL)}$ is the nominal value of $Q_{CONST}$ for the stage, and $Q_{CM-TARGET}$ is the target value of $Q_{CM-IN}$ for the stage. When this behavior is attained, then the CM-charge transfer function of the stage is obtained from Equation 6:

$$\begin{aligned} Q_{CM-OUT} &= Q_{CM-IN} + 1/2 C_6 V_{R1} + Q_{CONST} & \text{Equation 8} \\ &= Q_{CM-IN} + 1/2 C_6 V_{R1} + \\ & \quad [Q_{CONST(NOMINAL)} - (Q_{CM-IN} - Q_{CM-TARGET})] \\ &= Q_{CM-TARGET} + \\ & \quad 1/2 C_6 V_{R1} + Q_{CONST(NOMINAL)} \end{aligned}$$

According to Equation 8 the stage's output CM charge is constant, at its nominal value, independent of the value of input CM charge. This is the desired behavior: all effect of input CM charge variation is removed in the outgoing charge. The CM-charge correction provided by the circuit of FIG. 12 takes effect as the charge is transferred out of the stage shown and into the next stage; thus this correction technique is termed "common-mode-charge feed-forward correction".

Attaining the ideal relationship between $Q_{CM-IN}$ and $Q_{CONST}$, as expressed by Equation 7, requires correct gain and bias values in the correction circuitry, including the scaling between control signal 125 and the resulting change in $Q_{CONST}$ in charge-transfer circuits 3A and 3B. Good approximations to this ideal set of circuit parameters can be obtained by various means, including the use of replica methods similar to those described above. To the extent that a practical circuit implementation does not perfectly satisfy Equation 7, it will fail to suppress some fraction of $Q_{CM-IN}$'s deviation from $Q_{CM-TARGET}$. By applying this circuit technique in two or more pipeline stages, such residual CM-charge variation can be further suppressed.

Figure 13:
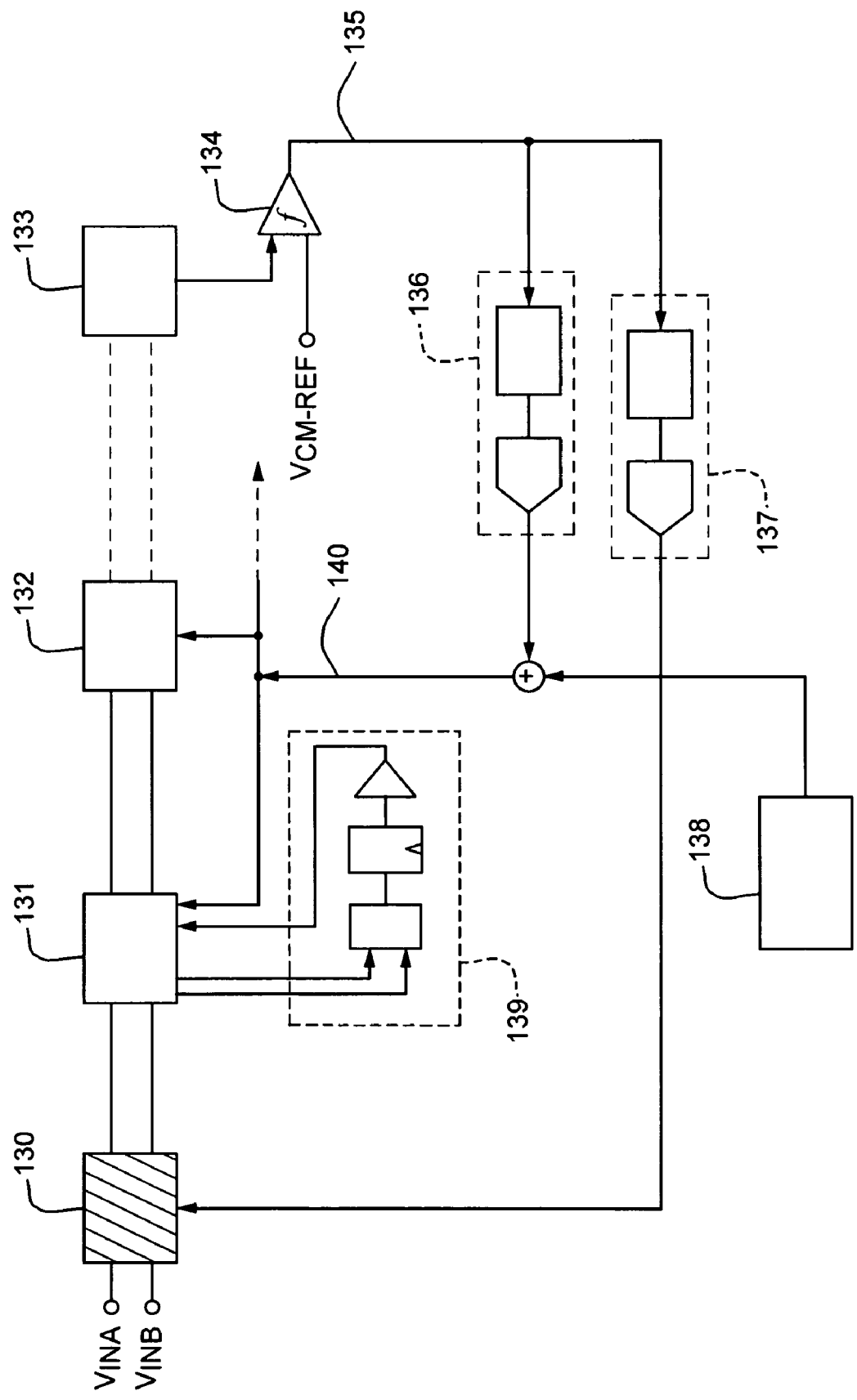
FIG. 13 shows a charge-domain pipeline circuit incorporating four distinct means of common-mode charge control.

It is advantageous in a complete charge-pipeline-based circuit such as an ADC to combine several aspects of this invention in a single circuit. FIG. 13 illustrates a charge pipeline circuit employing such a combination: in this example, all four aspects are combined. Note that FIG. 13 includes only pipeline features pertinent to CM-charge control. Other circuit features which would be part of an ADC application, for example, are not pertinent to the present discussion and are omitted.

Circuit 130 in FIG. 13 is an input circuit, such as a track-and-hold, which receives differential input voltage pair $V_{INA}$ and $V_{INB}$ and supplies sampled differential charge output pairs to first charge-pipeline stage 131. The pipeline shown consists of first pipeline stage 131, second stage 132, and final stage 133. (Typically additional stages would be interposed, as indicated by the dashed signal lines between stages 132 and 133.) All four CM-charge correction means discussed above are included in the circuit of FIG. 13. Replica circuit 138 is similar to the replica circuit 83 in FIG. 8. Common-mode charge feed-forward circuit 139 is similar to circuit 120 shown in FIG. 12. Comparator 134, with reference input $V_{CM-REF}$, provides its output 135 as input both to circuit 137, which is similar to the correction elements of FIG. 7, and to circuit 136, which is similar to the correction elements in FIG. 10. The control outputs of circuits 138 and 136 are added to produce control output 140, which adjusts $Q_{CONST}$ of pipeline stages 131 and 132 (and optionally later stages).

The mode of operation of the combined CM-charge control circuitry shown in FIG. 13 is as follows. Initially, only the replica-based circuit 138 is active; the other three CM-charge control blocks are disabled, such that they produce no alteration in CM charge in the pipeline. As discussed in connection with FIGS. 8 and 9, circuit 138 adjusts $Q_{CONST}$ in stages 131 and 132 (and optionally in subsequent stages) to near its target value. This is an open-loop adjustment, based on replica-based sensing of process and operating-condition effects; it remains in force as long as the circuit of FIG. 13 is in operation, and is unaffected by other CM-charge adjustments.

Next, circuit 137 is activated, and as discussed in connection with FIG. 7, it adjusts the CM charge output of input circuit 130 such that the CM charge in stage 133 reaches its target value, as sensed by comparator 134. This adjustment requires the presence of an input signal with the correct input CM voltage, and which has negligible sample-to-sample CM charge variation. In practical circuits, such an input signal is ordinarily provided by a special calibration signal source. Any errors in CM charge due to imperfect match between replica circuit 138 and the pipeline stages is also adjusted out during this procedure. After this adjustment is complete, the output of block 137 remains static. The calibration signal can be removed and the circuit's normal input connected.

Next, CM feed-forward circuit 139 is activated. As a result of its action, as discussed in connection with FIG. 12, any sample-to-sample variation of CM charge entering stage 131 is removed from stage 131's output. (In this example, the CM-control effects of CM-feed-forward circuit 139 and control voltage 140 are assumed to be combined within pipeline stage 131.) Ideally, activating circuit 139 would not change the average CM-charge output from stage 131; in practice, imperfections in circuit 139 would normally produce small changes in the stage 131's average CM charge output.

Due to such imperfections in circuit 139, and also to changes in circuit operating conditions such as temperature after the calibration step using circuit 137, the CM charge arriving at stage 133 typically deviates from its target value. The final step in controlling these deviations consists in activating feedback circuit 136. This circuit uses the output of comparator 134 to sense CM charge in pipeline stage 133 on an on-going basis, and regularly adjusts control voltage 140 to maintain that CM charge very near its target value.

In addition to their use individually, the embodiments of this invention may also be useful in other combinations for particular applications. For example, if the signal source does not contain CM variations, then CM-feed-forward circuit 139 could advantageously be omitted from FIG. 13.

Although the present invention is described above with primary reference to a charge-domain pipelined ADC, charge-domain pipelines are also useful in other signal-processing applications. The CM-charge correction means disclosed above are equally applicable to such applications.

While this invention has been particularly shown and described with references to example embodiments thereof, it will be understood by those skilled in the art that various changes in form and details may be made therein without departing from the scope of the invention encompassed by the appended claims.

What is claimed is:

1. A method of adjusting common-mode charge in a Bucket-Brigade Device (BBD) differential charge-domain pipeline having at least a first stage propagating charge toward a second stage, comprising:

comparing a reference voltage against an output voltage, the output voltage corresponding to a common-mode charge at the second stage of the charge-domain pipeline; and based on the comparison, controlling a common-mode charge output at the first stage such that the common-mode charge at the second stage is adjusted.

2. The method of claim 1, wherein the first stage comprises a pipeline input circuit receiving a differential voltage input and generating a differential charge output based on the differential voltage input.

3. The method of claim 1, wherein the first and second stages each comprise a differential charge-transfer device.

4. The method of claim 1, further comprising: generating a comparison signal indicating whether the output voltage is higher or lower than the reference voltage.

5. The method of claim 4, wherein controlling the common-mode charge output at the first stage further comprises: adjusting a control signal, based on the comparison signal, to increase or decrease the common-mode charge output at the first stage.

6. The method of claim 5, wherein adjusting the control signal further comprises incrementing a counter based on the comparison signal.

7. The method of claim 5, wherein adjusting the control signal further comprises: providing a charge, via a charge pump, to an integrator generating the control signal.

8. The method of claim 5, further comprising: maintaining the control signal at a constant value after adjusting the control signal.

9. The method of claim 1, further comprising: propagating a differential charge through at least a third stage of the charge domain pipeline, the differential charge having a common-mode component that is adjusted as a result of said controlling.

10. The method of claim 1, further comprising:
replicating operation of a charge-transfer circuit;
generating a replica control signal to control an output voltage resulting from the replicating toward a replica reference voltage; and
applying the replica control signal to control the common-mode charge output at the first stage.

11. The method of claim 10, further comprising: applying the replica control signal to control a common-mode charge output at a third stage of the differential charge-domain pipeline.

12. The method of claim 1, further comprising, at one or more stages of the charge transfer pipeline:
sampling a voltage corresponding to common-mode charge at any given stage;
comparing the voltage against a reference voltage; and
based on the comparison, controlling charge transfer circuits to adjust the common-mode charge output of the stage.

13. The method of claim 1, further comprising: repeating said comparing and controlling following a given delay in which an adjustment to the common mode charge resulting from of said controlling propagates from the first stage to the second stage.

14. The method of claim 1, wherein the common-mode charge at the second stage is a predetermined value.

15. A method of adjusting common-mode charge in a Bucket-Brigade Device (BBD) differential charge-domain pipeline having at least a first stage propagating charge toward a second stage, comprising:
replicating operation of a charge-transfer circuit;
generating a replica control signal to control an output voltage resulting from the replicating toward a replica reference voltage; and
applying the replica control signal to control a common-mode charge output at the first stage.

16. The method of claim 15, further comprising: applying the replica control signal to control a common-mode charge output at a third stage of the differential charge-domain pipeline.

17. A method of adjusting common-mode charge in a Bucket-Brigade Device (BBD) differential charge-domain pipeline having at least a first stage propagating charge toward a second stage, comprising:
sampling a voltage corresponding to common-mode charge at the first stage;
comparing the voltage against a reference voltage; and
based on the comparison, controlling charge transfer circuits to adjust the common-mode charge output of the first stage.

18. An apparatus for adjusting common-mode charge in a charge-domain pipeline having at least a first stage propagating charge toward a second stage, comprising:
a comparison circuit to compare a reference voltage against an output voltage, the output voltage corresponding to a common-mode charge at the second stage of the charge-domain pipeline; and
a control circuit to control a common-mode charge output at the first stage, based on the comparison, such that common-mode charge at the second stage is adjusted.

19. The apparatus of claim 18, wherein the first stage comprises a pipeline input circuit receiving a differential voltage input and generating a differential charge output based on the differential voltage input.

20. The apparatus of claim 18, wherein the first and second stages each comprise a differential charge-transfer device.

21. The apparatus of claim 18, wherein the comparator generates a comparison signal indicating whether the output voltage is higher or lower than the reference voltage.

22. The apparatus of claim 21, wherein the control circuit adjusts a control signal, based on the comparison signal, to increase or decrease the common-mode charge output at the first stage.

23. The apparatus of claim 22, wherein the control circuit increments a counter based on the comparison signal.

24. The apparatus of claim 22, wherein the control circuit provides a charge, via a charge pump, to an integrator generating the control signal.

25. The apparatus of claim 22, wherein the control circuit maintains the control signal at a constant value after adjusting the control signal.

26. The apparatus of claim 18, wherein the first stage propagates a differential charge through at least a third stage of the charge domain pipeline, the differential charge having a common-mode component that is adjusted by the control circuit.

27. The apparatus of claim 18, further comprising:
a replica circuit replicating operation of a charge-transfer circuit;
a replica control circuit to generate a replica control signal to control an output of the replica circuit toward a replica reference voltage, the replica control signal being applied to control the common-mode charge output at the first stage.

28. The apparatus of claim 27, wherein the replica control signal is applied to control a common-mode charge output at a third stage of the differential charge-domain pipeline.

29. The apparatus of claim 18, further comprising, at one or more stages of the charge transfer pipeline:
- a sampler to sample a voltage corresponding to common-mode charge at any given stage;
- a comparator to compare the voltage against a reference voltage; and
- a sampler control circuit that, based on the comparison, controls charge transfer circuits to adjust the common-mode charge output of the stage.

30. The apparatus of claim 18, wherein the common-mode charge at the second stage is a predetermined value.

31. An apparatus for adjusting common-mode charge in a charge-domain pipeline having at least a first stage propagating charge toward a second stage, comprising:
- a replica circuit replicating operation of a charge-transfer circuit;
- a replica control circuit to generate a replica control signal to control an output of the replica circuit toward a replica reference voltage, the replica control signal being applied to control a common-mode charge output at the first stage.

32. The apparatus of claim 31, wherein the replica control signal is applied to control a common-mode charge output at a third stage of the differential charge-domain pipeline.

33. An apparatus for adjusting common-mode charge in a charge-domain pipeline having at least a first stage propagating charge toward a second stage, comprising:
- a sampler to sample a voltage corresponding to common-mode charge;
- a comparator to compare the voltage against a reference voltage; and
- a sampler control circuit that, based on the comparison, controls charge transfer circuits to adjust the common-mode charge output of the stage.

* * * * *